United States Patent
Moon et al.

(10) Patent No.: US 6,960,521 B2
(45) Date of Patent: *Nov. 1, 2005

(54) METHOD AND APPARATUS FOR POLISHING METAL AND DIELECTRIC SUBSTRATES

(75) Inventors: Yongsik Moon, San Mateo, CA (US); David Mai, San Jose, CA (US); Kapila Wijekoon, Palo Alto, CA (US); Rajeev Bajaj, Fremont, CA (US); Rahul Surana, Fremont, CA (US); Yongqi Hu, Santa Clara, CA (US); Tony S. Kaushal, Cupertino, CA (US); Shijian Li, San Jose, CA (US); Jui-Lung Li, San Jose, CA (US); Shi-Ping Wang, Fremont, CA (US); Gary Lam, Santa Clara, CA (US); Fred C. Redeker, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/939,750
(22) Filed: Sep. 13, 2004
(65) Prior Publication Data
US 2005/0032381 A1 Feb. 10, 2005

Related U.S. Application Data

(63) Continuation of application No. 10/025,144, filed on Dec. 18, 2001, now Pat. No. 6,790,768.
(60) Provisional application No. 60/304,543, filed on Jul. 11, 2001.

(51) Int. Cl.$^7$ ................................................ B24B 1/00
(52) U.S. Cl. .................... 438/633; 438/687; 438/692; 451/41
(58) Field of Search ................................ 438/626, 633, 438/687, 690, 691, 692; 451/41

(56) References Cited

U.S. PATENT DOCUMENTS

| | | | |
|---|---|---|---|
| 5,234,867 | A | 8/1993 | Schultz et al. |
| 5,302,233 | A | 4/1994 | Kim et al. |
| 5,627,110 | A | 5/1997 | Lee et al. |
| 5,676,567 | A | 10/1997 | Gluskoter et al. |

(Continued)

FOREIGN PATENT DOCUMENTS

| | | |
|---|---|---|
| EP | 1 006 166 | 6/2000 |
| EP | 1 011 131 | 6/2000 |
| EP | 1 085 067 | 3/2001 |
| WO | WO 00/24842 | 5/2000 |

OTHER PUBLICATIONS

US 6,204,181, 3/2001, Molnar (withdrawn)
U.S. Appl. No. 09/469,709 filed Dec. 21, 1999.
European Search Report for EP 00 31 1569 dated Nov. 12, 2003.

*Primary Examiner*—Stephen W. Smoot
(74) *Attorney, Agent, or Firm*—Moser, Patterson & Sheridan

(57) ABSTRACT

Method and apparatus are provided for polishing substrates comprising conductive and low k dielectric materials with reduced or minimum substrate surface damage and delamination. In one aspect, a method is provided for processing a substrate including positioning a substrate having a conductive material formed thereon in a polishing apparatus having one or more rotational carrier heads and one or more rotatable platens, wherein the carrier head comprises a retaining ring and a membrane for securing a substrate and the platen has a polishing article disposed thereon, contacting the substrate surface and the polishing article to each other at a retaining ring contact pressure of about 0.4 psi or greater than a membrane pressure, and polishing the substrate to remove conductive material.

34 Claims, 6 Drawing Sheets

U.S. PATENT DOCUMENTS

| | | | | |
|---|---|---|---|---|
| 5,733,177 | A | 3/1998 | Tsuchiya et al. | |
| 5,738,574 | A | 4/1998 | Tolles et al. | |
| 5,786,275 | A | 7/1998 | Kubo | |
| 5,827,781 | A | 10/1998 | Skrovan et al. | |
| 5,853,604 | A | 12/1998 | Kim | |
| 5,876,266 | A | 3/1999 | Miller et al. | |
| 5,897,426 | A | 4/1999 | Somekh | |
| 5,952,243 | A | 9/1999 | Forester et al. | |
| 5,976,979 | A | 11/1999 | Chen | |
| 5,985,748 | A | 11/1999 | Watts et al. | |
| 6,001,730 | A | 12/1999 | Farkas et al. | |
| 6,024,630 | A | 2/2000 | Shendon et al. | |
| 6,068,879 | A | 5/2000 | Pasch | |
| 6,083,840 | A | 7/2000 | Mravic et al. | |
| 6,113,465 | A | 9/2000 | Kim et al. | |
| 6,114,247 | A | 9/2000 | Nakamura et al. | |
| 6,117,775 | A | 9/2000 | Kondo et al. | |
| 6,121,143 | A * | 9/2000 | Messner et al. | 438/692 |
| 6,121,144 | A | 9/2000 | Marcyk et al. | |
| 6,136,138 | A | 10/2000 | Yagisawa | |
| 6,153,525 | A | 11/2000 | Hendricks et al. | |
| 6,156,659 | A | 12/2000 | Roy | |
| 6,183,354 | B1 | 2/2001 | Zuniga et al. | |
| 6,184,139 | B1 | 2/2001 | Adams et al. | |
| 6,184,141 | B1 | 2/2001 | Avanzino et al. | |
| 6,187,683 | B1 | 2/2001 | DeSanti et al. | |
| 6,217,416 | B1 | 4/2001 | Kaufman et al. | |
| 6,244,935 | B1 | 6/2001 | Birang et al. | |
| 6,274,478 | B1 | 8/2001 | Farkas et al. | |
| 6,276,996 | B1 | 8/2001 | Chopra | |
| 6,276,998 | B1 | 8/2001 | Sommer et al. | |
| 6,435,942 | B1 | 8/2002 | Jin et al. | |
| 6,435,945 | B1 | 8/2002 | Somekh | |
| 6,444,569 | B2 | 9/2002 | Farkas et al. | |
| 6,451,697 | B1 | 9/2002 | Sun et al. | |
| 6,482,743 | B1 | 11/2002 | Sato | |
| 6,569,349 | B1 | 5/2003 | Wang et al. | |
| 6,579,153 | B2 | 6/2003 | Uchikura et al. | |
| 6,602,436 | B2 | 8/2003 | Mandigo et al. | |
| 6,616,717 | B2 | 9/2003 | Sachan et al. | |
| 6,790,768 | B2 * | 9/2004 | Moon et al. | 438/633 |
| 2001/0004538 | A1 | 6/2001 | Li et al. | |
| 2001/0024933 | A1 | 9/2001 | Sachan et al. | |
| 2001/0039166 | A1 | 11/2001 | Tran et al. | |
| 2001/0039168 | A1 * | 11/2001 | Tran et al. | 451/36 |
| 2002/0058426 | A1 | 5/2002 | Mandigo et al. | |
| 2002/0151253 | A1 * | 10/2002 | Kollodge et al. | 451/41 |
| 2003/0022497 | A1 | 1/2003 | Li et al. | |
| 2003/0029841 | A1 | 2/2003 | Moon et al. | |

* cited by examiner

METHOD AND APPARATUS FOR POLISHING METAL AND DIELECTRIC SUBSTRATES

CROSS-REFERENCE TO RELATED APPLICATIONS

This application is a continuation of U.S. patent application Ser. No. 10/025,144, filed Dec. 18, 2001, now U.S. Pat. No. 6,790,768, which claims benefit of U.S. Provisional Patent Application Ser. No. 60/304,543, filed Jul. 11, 2001, which applications are incorporated by reference herein.

BACKGROUND OF THE INVENTION

1. Field of the Invention

Aspects of the invention generally relate to the fabrication of semiconductor devices and to chemical mechanical polishing and planarization of semiconductor devices.

2. Description of the Related Art

Reliably producing sub-half micron and smaller features is one of the key technologies for the next generation of very large scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lay at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity for conductors and materials having low dielectric constant (low k, defined herein as having dielectric constants, k, less than about 4.0) as insulating layers to reduce the capacitive coupling between adjacent interconnects. Increased capacitative coupling between layers can detrimentally affect the functioning of semiconductor devices.

One conductive material gaining acceptance is copper and its alloys, which have become the materials of choice for sub-quarter-micron interconnect technology because copper has lower resistivity than aluminum, (1.7 $\mu\Omega$-cm compared to 3.1 $\mu\Omega$-cm for aluminum), higher current, and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper-containing materials and low k dielectric materials are being developed.

One method for forming vertical and horizontal interconnects is by a damascene or dual damascene method. In the damascene method, one or more dielectric materials, such as low k dielectric materials, are deposited and pattern etched to form the vertical interconnects, i.e., vias, and horizontal interconnects, i.e., lines. Conductive materials, such as copper-containing materials, and other materials, such as barrier layer materials used to prevent diffusion of copper-containing materials into the surrounding low k dielectric, are then inlaid into the etched pattern. Any excess copper-containing materials and excess barrier layer material external to the etched pattern, such as on the field of the substrate, is then removed.

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in dual damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing article in a CMP apparatus. The carrier assembly provides a controllable pressure to the substrate urging the substrate against the polishing article. The article is moved relative to the substrate by an external driving force. Thus, the CMP apparatus effects polishing or rubbing movement between the surface of the substrate and the polishing article while dispersing a polishing composition to effect both chemical activity and mechanical activity.

Conventionally, in polishing copper features, such as dual damascene features, the copper-containing material, and a portion of the barrier layer, is polished to the level of the barrier layer, and then the barrier layer is polished, with a portion of the dielectric layer and copper features, to a level of the underlying dielectric layer. However, conventional polishing processes often result in uneven removal of the copper features and the dielectric layer resulting in the formation of topographical defects, such as concavities or depressions in the copper features, referred to as dishing, and excess removal of dielectric material surrounding the copper features, referred to as erosion.

FIG. 1 is a schematic view of a substrate illustrating the phenomenon of dishing. Conductive lines 11 and 12 are formed by depositing conductive materials, such as copper or copper alloy, in a feature definition formed in the dielectric layer 10, typically comprised of silicon oxides or other dielectric materials. After planarization, a portion of the conductive material is depressed by an amount D, referred to as the amount of dishing, forming a concave copper surface. Dishing results in a non-planar surface that impairs the ability to print high-resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

An additional difficulty also arises when using low k dielectric material in copper dual damascene formation. Low k dielectric materials are typically soft, porous, and brittle. Current polishing pressures, about 4 psi or greater, can damage the low k dielectric material and form defects in the substrate surface such as film delamination due to high shear stress caused by the friction between the polishing pad and substrate surface.

One proposed solution to reduce dishing and polish low k dielectric material with reduced defect formation is to polish substrates at reduced polishing pressures. However, polishing substrates at reduced pressures often results in less than desirable polishing rates, non-uniform polishing, and less than desirable planarization of the substrate surface. Such undesirable processing of the substrate surface may also result in reduced substrate throughput and less than desirable polish quality of the substrate surface. Additionally delamination has also been observed to occur at reduced polishing pressures.

Additionally, low polishing pressure processes may be unable to sufficiently remove all of the desired copper materials from a substrate surface such as at the interface between copper and the barrier layer, which is generally non-planar. The remaining copper materials, or residues, can detrimentally affect device formation, such as creating short-circuits within or between devices, reduce device yields, reduce substrate throughput, and detrimentally affect the polish quality of the substrate surface.

Therefore, there exists a need for an apparatus and method that reduce or minimize the formation of topographical defects and film delamination during processing.

SUMMARY OF THE INVENTION

Aspects of the invention relate generally to methods and apparatus for polishing substrates comprising conductive materials and low k dielectric films with reduced or minimum substrate surface damage and delamination. In one aspect, a method is provided for processing a substrate including positioning a substrate having a conductive material formed thereon in a polishing apparatus having one or more rotational carrier heads and one or more rotatable platens, wherein the carrier head comprises a retaining ring and a membrane for securing a substrate in the carrier head and the platen has a polishing article disposed thereon, contacting the substrate surface with the polishing article at a ratio of retaining ring contact pressure to membrane pressure of greater than about 1.1:1, and polishing the substrate to remove conductive material.

In another aspect, a method is provided for processing a substrate including positioning a substrate having copper features formed in a low k dielectric layer, and a tantalum containing material disposed therebetween, in a polishing apparatus having one or more rotational carrier heads and one or more rotatable platens, wherein the carrier head comprises a retaining ring and a membrane for securing the substrate in the carrier head and the platen has a polishing article disposed thereon, contacting the substrate surface and the polishing article to each other at a retaining ring contact pressure of about 0.4 psi or greater than a membrane pressure at a ratio of retaining ring contact pressure to membrane pressure greater than about 1.1:1 and less than or equal to about 5.5:1, polishing the substrate at a first relative linear velocity of about 600 mm/second or greater at the center of the substrate, and polishing the substrate at a second relative linear velocity less than about 600 mm/second at the center of the substrate, wherein the carrier head rotational speed is greater than the platen rotational speed by a ratio of carrier head rotational speed to platen rotational speed of greater than about 1:1.

In another aspect, a method is provided for processing a substrate including positioning a substrate having a conductive material formed thereon to a polishing apparatus having one or more rotational carrier heads and one or more rotatable platens, wherein the carrier head comprises a retaining ring and a membrane for securing a substrate in the carrier head and the platen has a polishing article disposed thereon, polishing the substrate at a first polishing pressure and a first platen rotational speed with a first retaining ring contact pressure between about 0.4 psi or greater than a first membrane pressure and at a first ratio of retaining ring contact pressure to membrane pressure of greater than about 1.1:1, and polishing the substrate at a second polishing pressure less than the first polishing pressure and a second platen rotational speed less than the first platen rotational speed at a ratio of a second carrier head rotational speed to second platen rotational speed of greater than about 1:1 with a second retaining ring contact pressure of about 0.4 psi or greater than a second membrane pressure and at a second ratio of second retaining ring contact pressure to second membrane pressure of greater than about 1.1:1.

In one aspect, a method is provided for processing a substrate including providing a substrate having a conductive material disposed thereon to a polishing apparatus, polishing the substrate at a first relative linear velocity between about 600 mm/second and about 1675 mm/second at the center of the substrate, and polishing the substrate at a second relative linear velocity between about 20 mm/second and about 600 mm/second at the center of the substrate.

In another aspect, an apparatus for processing a substrate including one or more platens adapted for polishing a substrate, and a computer based controller configured to cause the system to perform a method comprising polishing the substrate at a first relative linear velocity between about 600 mm/second and about 1675 mm/second at the center of the substrate and polishing the substrate at a second relative linear velocity between about 20 mm/second and about 600 mm/second at the center of the substrate.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide methods and apparatus for polishing substrates having conductive materials and low k dielectric films disposed thereon with reduced or minimum substrate surface damage and delamination. The invention will be described below in reference to a planarizing process for the removal of conductive materials, such as copper-containing materials, formed in feature definitions of low k dielectric materials by chemical mechanical polishing (CMP) techniques. Chemical mechanical polishing is broadly defined herein as polishing a substrate by a combination of both chemical and mechanical activity.

The planarizing process and composition that can used to polish a substrate disposed in chemical mechanical polishing process equipment, such as the MIRRA® polishing system, the MIRRA® MESA™ polishing system, and the REFLEXION™ polishing system, all of which are available from Applied Materials, Inc., The MIRRA® polishing system is further described in U.S. Pat. No. 5,738,574, entitled, "Continuous Processing System for Chemical Mechanical Polishing," the entirety of which is incorporated herein by reference to the extent not inconsistent with the invention.

Although, the processes and compositions described herein are illustrated utilizing a three platen system, such as the MIRRA® polishing system, any system enabling chemical mechanical polishing using the composition or processes described herein can be used to advantage. Examples of other suitable apparatus include orbital polishing systems, such as the OBSIDIAN 8200C System available from Applied Materials, Inc., or a linear polishing system, using a sliding or circulating polishing belt or similar device. An example of a linear polishing system is more fully described in co-pending U.S. patent application Ser. No. 09/244,456, now U.S. Pat. No. 6,244,935, filed on Feb. 4, 1999, and incorporated herein by reference to the extent not inconsistent with the invention.

Figure 1:
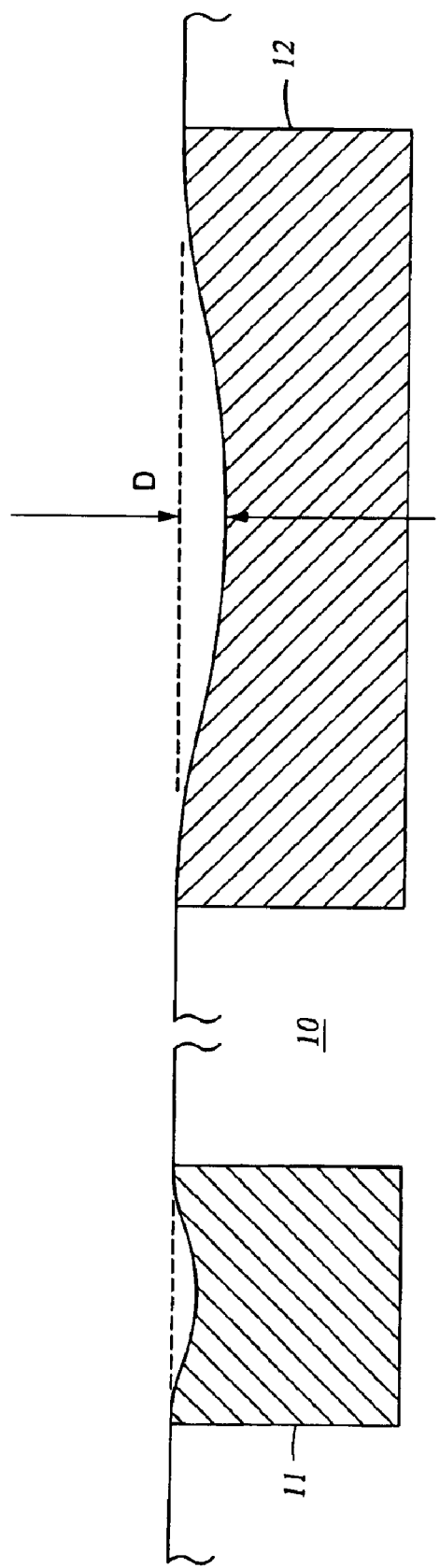
FIG. 1 is a schematic view of a substrate illustrating the phenomenon of dishing.
Figure 2:
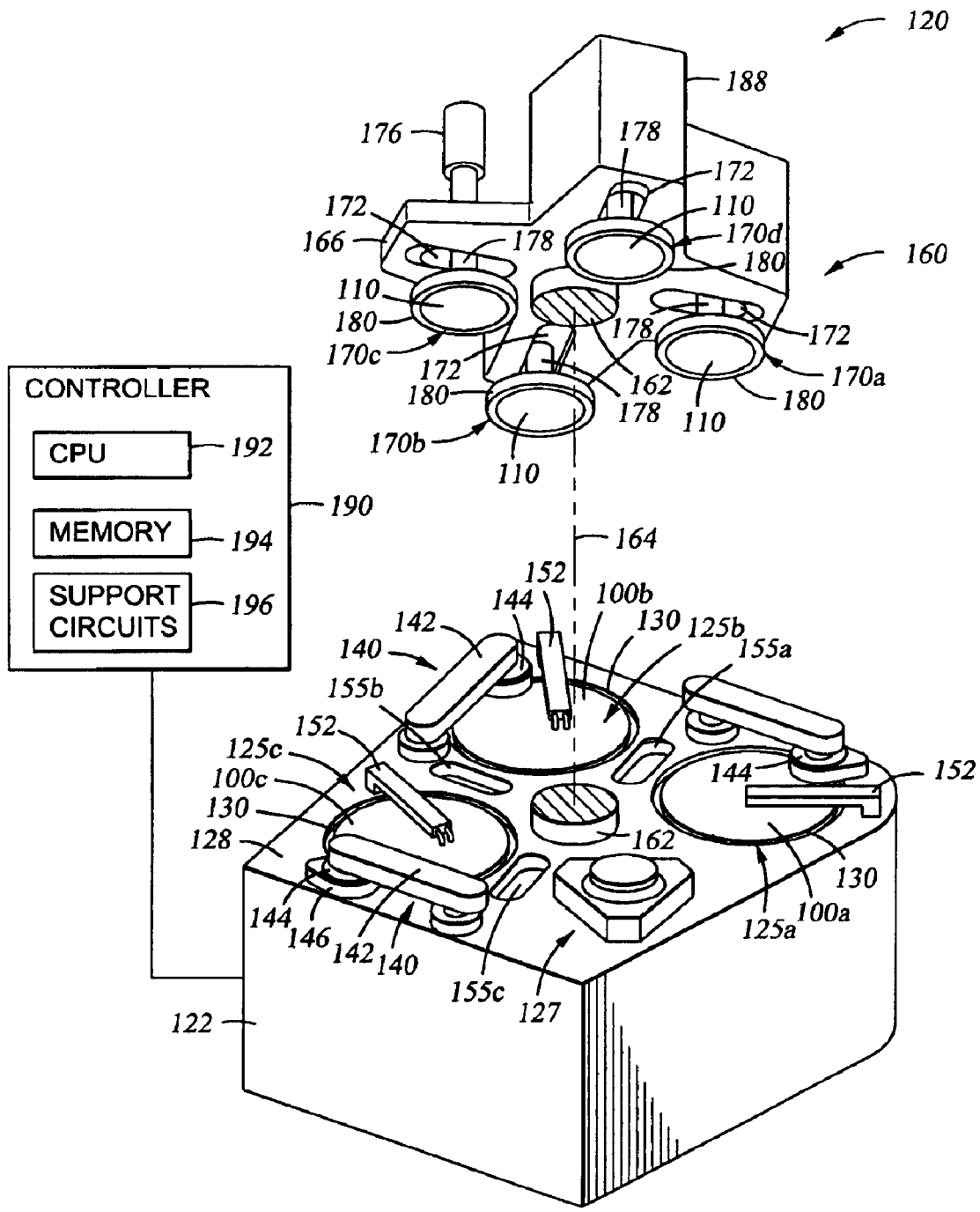
FIG. 2 is a schematic perspective view of a chemical mechanical polishing apparatus.

FIG. 2 is a schematic perspective view of a chemical mechanical polishing system or apparatus 120 for performing the planarizing processes and for use with the CMP compositions described herein. The polishing apparatus 120 includes a lower machine base 122 with a table top 128 mounted thereon and a removable outer cover (not shown). The table top 128 supports a series of polishing stations, including a first polishing station 125a, a second polishing station 125b, a final polishing station 125c, and a transfer station 127. The transfer station 127 serves multiple functions, including, for example, receiving individual substrates 110 from a loading apparatus (not shown), washing the substrates, loading the substrates into carrier heads 180, receiving the substrates 110 from the carrier heads 180, washing the substrates 110 again, and transferring the substrates 110 back to the loading apparatus.

A computer based controller 190 is connected to the polishing system or apparatus 120 for instructing the system to perform one or more processing steps on the system, such as polishing a substrate or transferring a substrate in the polishing apparatus 120. In one embodiment, the invention may be implemented as a computer program-product for use with a computer system or computer based controller 190. The programs defining the functions of the preferred embodiment can be provided to a computer via a variety of signal-bearing media and/or computer readable media, which include but are not limited to, (i) information permanently stored on non-writable storage media (e.g., read-only memory devices within a computer such as read only CD-ROM disks readable by a CD-ROM or DVD drive; (ii) alterable information stored on a writable storage media (e.g., floppy disks within diskette drive or hard-disk drive); or (iii) information conveyed to a computer by communications medium, such as through a computer or telephone network, including wireless communication. Such signal-bearing media, when carrying computer-readable instructions that direct the functions of the invention, represent alternative embodiments of the present invention. It may also be noted that portions of the product program may be developed and implemented independently, but when combined together are aspects described herein.

Each polishing station 125a–125c includes a rotatable platen 130 having a polishing article, such as polishing pads 100a, 100b, or 100c disposed thereon. The polishing pad is a polishing pad having a durable roughened surface typically composed of microporous polyurethane or polyurethane mixed with filler.

Polishing pads 100a, 100b and 100c may be embossed or stamped with a pattern to improve distribution of slurry across the face of the substrate. However, it is believed that the corners or edges of the patterns formed in the polishing pad surface may perform as a "blade" or cutting surface that may damage low k dielectric films and increase surface friction during polishing, which can lead to increased film delamination, and that a pattern-free, i.e., corner-free, polishing pad is typically used when polishing substrates with the processes described herein. Polishing pads 100a, 100b, and 100c may also have "windows" of transparent materials formed through the polishing pad for use with infrared devices for measuring layer thickness. However, it is believed that the seams of between the polishing pad material and the transparent material also form corners or grooves in the surfaces of the polishing pads. Thus, a window-less, or solid, polishing pad is typically used to polish substrates by the processes described herein.

Polishing pads 100a, 100b and 100c may include a hard polishing material, a soft polishing material, or combinations thereof. A hard polishing material is broadly described herein as a polishing material having a polishing surface of a hardness of about 50 or greater on the Shore D Hardness scale for polymeric materials as described and measured by the American Society for Testing and Materials (ASTM), headquartered in Philadelphia, Pa. A suitable hard polishing material is a material comprising the IC-1000, IC-1010, and the IC-1400 polishing pads available from Rodel Inc., of Phoenix Ariz. (IC-1000 is a product name of Rodel, Inc.)

The polishing pads 100a, 100b, and 100c may also include composite pads of one or more layers, with a surface layer having a hardness of about 50 or greater on the Shore D Hardness scale. The composite pads may have an overall hardness of less than about 50 on the Shore D Hardness scale. While the description herein describes the use of the IC series of pads from Rodel Inc., the invention is equally applicable to all polishing pads having the hardness described herein.

A soft polishing material is broadly described herein as a polishing material having a polishing surface of a hardness of less than about 50 on the Shore D Hardness scale for polymeric materials as described and measured by the American Society for Testing and Materials (ASTM), headquartered in Philadelphia, Pa. The soft polishing pad may be composed of a napped poromeric synthetic material, such as a uniformly compressible material including a polymeric material, i.e., plastic, and/or foam, felt, rubber, or a combination thereof. An example of a soft polishing material is polyurethane impregnated with felt. An example of a soft polishing pad is the POLITEX or SUBA series, i.e., SUBA IV, of polishing pads available from Rodel, Inc. (POLITEX and SUBA are tradenames of Rodel Inc.)

Alternatively, polishing pads 100a, 100b, 100c may be a standard two-layer pad in which the upper layer has a durable roughened surface and is harder than the lower layer. For example, the upper layer of the two-layer pad may be composed of microporous polyurethane or polyurethane mixed with filler, whereas the lower layer maybe composed of compressed felt fibers leached with urethane. Both the upper and lower layers may be approximately fifty mils thick. A two-layer standard pad, with the upper layer composed of IC-1000 and the lower layer composed of SUBA-4, is available from Rodel (IC-1000 and SUBA-4 are product names of Rodel, Inc.).

In one embodiment of the apparatus, the first polishing station 125a has a first hard polishing pad for the first polishing pad 100a disposed on a platen 130, and the platen 130 disposed thereon is adapted for polishing a substrate to remove copper-containing material disposed on the substrate. The second polishing station 125b has a second hard polishing pad for the second polishing pad 100b disposed on a platen 130, and the platen 130 disposed thereon is adapted for polishing a substrate to remove barrier layer material disposed on the substrate. A third polishing station 125c having a soft polishing pad for the polishing pad 100c may be used for a buffing process, such as removing oxide, scratches, and surface defects formed during copper-containing and barrier material removal processes.

A rotatable linear platen may be used for the second polishing station 125b. An example of a linear polishing system, and an example of a polishing system having a rotatable polishing pad and a rotatable linear platen, is more fully described in co-pending U.S. patent application Ser. No. 09/244,456, now U.S. Pat. No. 6,244,935 filed on Feb. 4, 1999, and incorporated herein by reference to the extent not inconsistent with the invention. Alternatively, a stationary platen or a rotatable or linear platen having a stationary article may be used for the first, second, or third polishing stations 125a, 125b, and 125c.

Aspects of the invention also contemplate the use of an orbital polishing process or orbital polishing platen for the first, second, and/or third polishing stations 125a, 125b, and 125c. A substrate and the polishing article can be moved in an orbital relative motion in a linear drive system where the article is stationary, an example of an apparatus capable of performing the orbital relative motion between the polishing article and substrate is the MODEL 8200, available from Applied Materials Inc., of Santa Clara, Calif.

Each platen 130 may be a rotatable aluminum or stainless steel platen connected to a platen drive motor (not shown). A platen drive motor (not shown) rotates each platen 130 between about 0 revolutions per minute (rpms), i.e., stationary, and about 200 rpms, although higher rotational speeds may be obtained through modifying the platen motor. The polishing stations 125a–125c may include a pad conditioner apparatus 140. The pad conditioner apparatus 140 has a rotatable arm 142 holding an independently rotating conditioner head 144 and an associated washing basin 146. The pad conditioner apparatus 140 maintains the condition of the polishing pad so that it will effectively polish the substrates. Each polishing station may include a conditioning station if the CMP apparatus is used with other article configurations.

The polishing stations 125a–125c may each have a composition delivery/rinse arm 152 that includes two or more supply tubes to provide one or more CMP compositions, cleaning compositions, and/or water to the surface of the polishing article. The composition delivery/rinse arm 152 delivers the one or more chemical slurries in amounts sufficient to cover and wet the entire polishing article, typically between about 50 milliliters per minute (ml/min) and about 500 ml/min. Each composition delivery/rinse arm 152 also includes several spray nozzles (not shown) that can provide a high-pressure fluid rinse on to the polishing article at the end of each polishing and conditioning cycle. Furthermore, two or more intermediate washing stations 155a, 155b, and 155c may be positioned between adjacent polishing stations 125a, 125b, and 125c to clean the substrate as it passes from one station to the next.

A rotatable multi-head carousel 160 is positioned above the lower machine base 122. The carousel 160 includes four carrier head systems 170a, 170b, 170c, and 170d. Three of the carrier head systems receive or hold the substrates 110 by pressing them against the polishing pads 100a, 100b, and 100c disposed on the polishing stations 125a–125c. One of the carrier head systems 170a–170d receives a substrate from and delivers a substrate 110 to the transfer station 127. The carousel 160 is supported by a center post 162 and is rotated about a carousel axis 164 by a motor assembly (not shown) located within the machine base 122. The center post 162 also supports a carousel support plate 166 and a cover 188.

The four carrier head systems 170a–170d are mounted on the carousel support plate 166 at equal angular intervals about the carousel axis 164. The center post 162 allows the carousel motor to rotate the carousel support plate 166 and orbit the carrier head systems 170a–170d about the carousel axis 164. Each carrier head system 170a–170d includes one carrier head 180. A carrier drive shaft 178 connects a carrier head rotation motor 176 (shown by the removal of one quarter of the cover 188) to the carrier head 180 so that the carrier head 180 can independently rotate about its own axis. The carrier head motor may rotate the carrier head between about 0 revolutions per minute (rpms), i.e., stationary, and about 200 rpms, although higher rotational speeds may be obtained through modifying the carrier head motor. There is one carrier drive shaft 178 and motor 176 for each head 180. In addition, each carrier head 180 independently oscillates laterally in a radial slot 172 formed in the carousel support plate 166.

Figure 3:
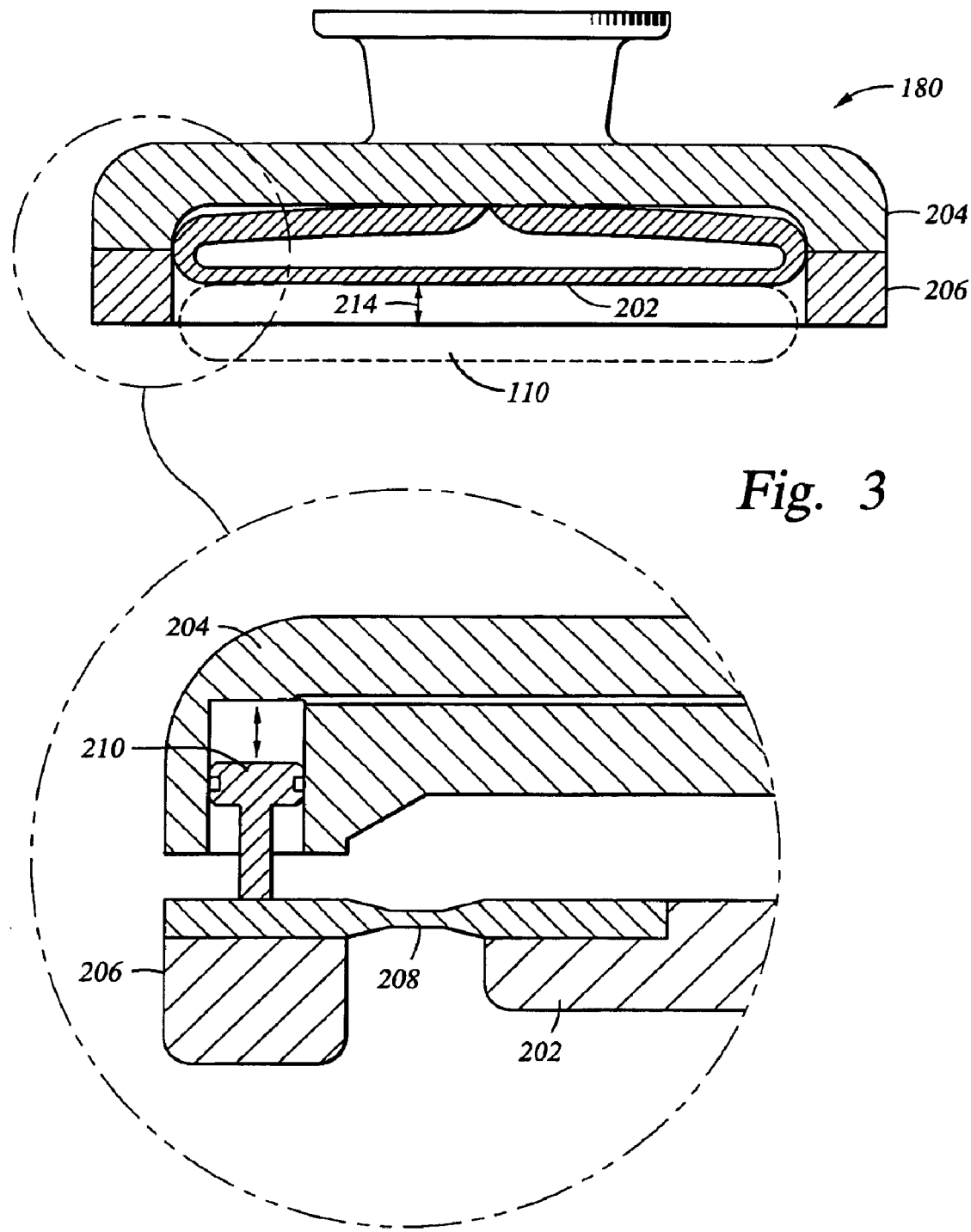
FIG. 3 is a cross-sectional view of one embodiment of a polishing head.
Figure 4:
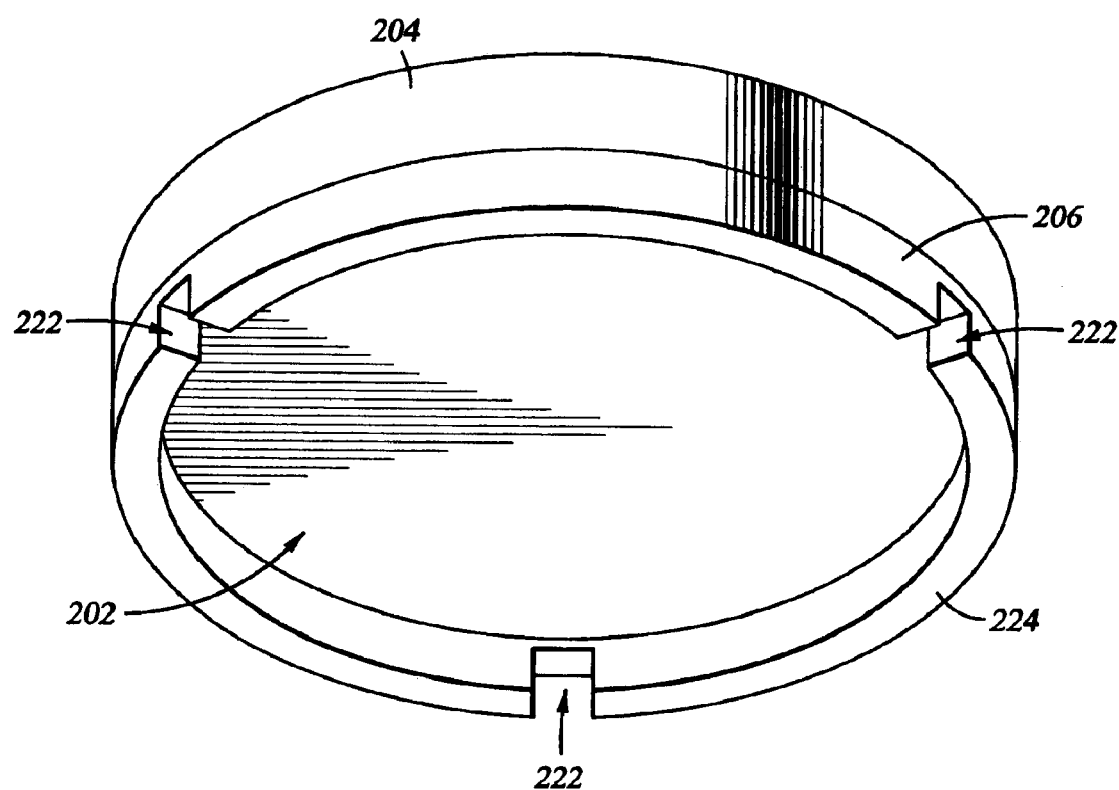
FIG. 4 is a perspective view of a retaining ring of the polishing head depicted in FIG. 3.

FIG. 3 depicts a sectional view of the carrier head 180. The carrier head 180 generally includes a carrier plate 202, a cover 204, and a retaining ring 206. The carrier plate 202, which in one embodiment may comprise an inflatable bladder or membrane, generally presses the substrate 110 against the polishing and plating stations 100A, 100B and 100C. The retaining ring 206 generally circumscribes the carrier plate 202 and prevents the substrate 110 from moving laterally out from under the carrier head 180 during processing. The retaining ring 206 may include one or more grooves 222 disposed in a lower surface 224 of the retaining ring 206 as shown in FIG. 4. The grooves 222 generally have a radial orientation. In one embodiment, the ring 206 contains at least three grooves. However, it is believed that grooves in the retaining ring 206 has corners or edges which may damage low k dielectric films and contribute to frictional forces that increase film delamination; and that a grooveless retaining ring is used when polishing substrates with the processes described herein.

Returning to FIG. 3, the carrier plate 202 and retaining ring 206 are generally movable relative to one another in an axial direction. A relative distance 214 between the carrier plate's bottom and the retaining ring 206 may be controlled thus setting the relative distance that the substrate 110 extends beyond the retaining ring 206 or the amount of pressure the retaining ring 206 exerts upon the polishing or processing table 100A, 100B, and 100C.

In the embodiment depicted in the enlargement of FIG. 3, the retaining ring 206 is movably coupled to the carrier head 180 by a flexure 208. The flexure 208, which may be a flexible metal sheet or polymer, is disposed between the retaining ring 206 and the carrier plate 202 to allow axial movement therebetween. A piston 210 disposed in the cover 204 is coupled to the retaining ring 206. Fluid is supplied to (or removed from) the piston 210 and urges the retaining ring 206 in the axial direction, thereby defining the distance 214. Examples of other embodiments of polishing heads 130 that have a retaining ring and a carrier plate positional relative to each other are described in U.S. Pat. No. 6,024,630, issued Feb. 25, 2000 to Shendon, et al.; U.S. patent application Ser. No. 08/861,260, now U.S. Pat. No. 6,183,354, filed May 21, 1997 by Zuniga; and U.S. patent application Ser. No. 09/258,042, now U.S. Pat. No. 6,276,998, filed Feb. 25, 1999 by Somer, et al., all of which are hereby incorporated by reference in their entireties.

The carrier head 180 performs several mechanical functions. Generally, the carrier head 180 holds the substrate 110 against the polishing pads 100a, 100b, and 100c, evenly distributes a downward pressure across the back surface of the substrate 110, transfers torque from the drive shaft 178 to the substrate 110, and ensures that the substrate 110 does not slip out from beneath the carrier head 180 during polishing operations.

To facilitate control of the system as described above, the controller 190 may include a CPU 192 of FIG. 2, which CPU 192 may be one of any form of computer processors that can be used in an industrial setting for controlling various chambers and subprocessors. The memory 194 is coupled to the CPU 192. The memory 194, or computer-readable medium, may be one or more of readily available memory such as random access memory (RAM), read only memory (ROM), floppy disk, hard disk, or any other form of digital storage, local or remote for storing information and instructions to be executed by the CPU 192.

The support circuits 196 are coupled to the CPU 192 for supporting the processor in a conventional manner. These circuits include cache, power supplies, clock circuits, input/output circuitry and subsystems, and can include input devices used with the controller 190, such as keyboards, trackballs, a mouse, and display devices, such as computer monitors, printers, and plotters. Such controllers 190 are commonly known as personal computers; however, the aspects described herein are not limited to personal computers and can be implemented on workstations, minicomputers, mainframes, and supercomputers.

A process, for example a polishing process described below, is generally stored in the memory 194, typically as a software routine. The software routine may also be stored and/or executed by a second CPU (not shown) that is remotely located from the hardware being controlled by the CPU 192.

Although the aspects described herein are discussed as being implemented as a software routine, some or all of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Chemical Mechanical Polishing Process

In one aspect of the invention, a method is provided for planarizing a substrate surface including positioning a substrate having a conductive material formed thereon to a polishing apparatus having one or more rotational carrier heads and one or more rotatable platens, wherein the carrier head comprises a retaining ring and a membrane for securing a substrate and the platen has a polishing article disposed thereon, contacting the substrate surface and the polishing article at a ratio of retaining ring contact pressure to membrane pressure greater than about 1.1:1, at a retaining ring contact pressure of about 0.4 psi or greater than a membrane pressure, or combinations thereof, and polishing the substrate to remove conductive material.

The retaining ring contact pressure is the pressure between the retaining ring and the polishing article during polishing and is generally between about 11 psi or less, such as between 2 psi and 11 psi. Low k materials may be polished under such retaining ring contact pressures, but low k materials are typically polished at retaining ring contact pressure between about 0 psi and about 2 psi. The membrane pressure is the pressure applied to the backside of the substrate secured in the carrier head by the membrane. The membrane pressure is generally about 6 psi or less, such as about 1 psi or less, during substrate polishing. Low k materials may be polished under such membrane pressures, but low k materials are typically polished at membrane pressures of about 2 psi or less. Additionally, a non-pressurized or "deflated" membrane, i.e., an applied pressure of about 0 psi by the membrane, may also be used during the polishing process.

Generally, a pressure ratio of retaining ring contact pressure to membrane pressure greater than about 1.1:1 and less than or equal to about 5.5:1 may be used. The pressure ratio of retaining ring contact pressure to membrane pressure may be between about 1.1:1 and about 5.5:1. However, the invention contemplates ratios greater than about 5.5:1 for apparatus that may be develop developed to provide such a pressure ratio.

An example of a ratio is 2.5:1, or simply 2.5, which may be a retaining ring contact pressure of about 5 psi and a membrane pressure of about 2 psi, a difference of about 3 psi. A pressure ratio of retaining ring contact pressure to membrane pressure between about 2:1 and 3.5:1 has been observed to produce effective polishing of the substrate surface with minimal or reduced delamination of films thereon.

The retaining ring contact pressure is about 0.4 psi or greater than the membrane pressure, such as a retaining ring pressure between about 2 psi and about 7.5 psi greater than the membrane pressure as used herein. A retaining ring pressure between 3 and about 6 psi greater than the membrane pressure has been used to polish substrates and has been observed to result in substrates with minimal film damage and delamination.

In one aspect of the invention, reduced film defects, reduced residual material, and reduced delamination may be achieved by having a carrier head rotational speed greater than a platen rotational speed by a ratio of carrier head rotational speed to platen rotational speed of greater than about 1:1, such as a ratio of carrier head rotational speed to platen rotational speed between about 2:1 and about 12:1, to remove conductive material. A ratio of carrier head rotational speed to platen rotational speed of between about 10:1 and about 12:1 has been used to effectively remove conductive material with minimal or reduced film delamination.

The difference in the carrier head rotational speed and platen rotational speed may be also characterized by the carrier head rotational speed being between about 100% and about 1100% as fast as than the platen rotational speed or may be characterized as the carrier head rotational speed being between about 2 and about 12 times greater than the platen rotational speed.

A polishing step having the ratio of carrier head rotational speed to platen rotational speed of between about 12:1 and about 1:1 typically provides a second relative linear velocity between about 20 mm/second and about 1675 mm/second, respectfully. A relative linear velocity between about 600 mm/second and about 1675 mm/second may be used for effective removal of bulk conductive materials, and a relative linear velocity between about 20 mm/second and less than or equal to about 600 mm/second, such as about 550 mm/seconds, may be used for effective removal of residual conductive materials.

The linear velocities described herein, for example, may be produced by carrier head rotational speeds between about 10 rpm and about 200 rpm and platen rotational speeds between about 10 rpm and about 200 rpm. The invention contemplates the use of higher rotational speeds for the carrier head and platen than those illustrate herein. For example, a platen rotating speed of 93 rpm may provide a relative linear velocity of about 1675 mm/second. Relative linear velocity polishing processes are more further described in U.S. patent application Ser. No. 60/304,543, filed on Jul. 11, 2001, now U.S. Pat. No. 6,790,768, which is incorporated by reference herein.

The relative linear velocity of the substrate is usually considered the linear velocity at the center of the substrate. For a rotating substrate, the average relative linear velocity typically increases when measured further from the center of the substrate. Additionally, the relative linear velocity of the substrate increases as the substrate is moved from the center of a rotating polishing article. An example of a relative linear velocity at the rotational speeds and rotational speed ratios described herein may produce a linear velocity between about 20 mm/second and about 1675 mm/second at the center of a substrate displaced approximately 12.5 cm to 13 cm from the rotating polishing article axis.

The polishing process described herein may be used to polish bulk conductive material from the substrate surface with reduced or minimal residual materials. Bulk material, such as copper-containing material, is broadly defined herein as material deposited on the substrate in an amount sufficient to fill features formed on the substrate surface and cover about 25% or more of the surface area of the substrate. Bulk material is generally deposited to a sufficient thickness to cover the entire substrate surface above a dielectric layer. Bulk copper-containing material can include copper, copper alloys, and/or doped copper.

Residual material is broadly defined as any bulk material that covers about 25% or less of the surface area of the substrate after one or more polishing process steps using abrasive containing or abrasive-free polishing compositions with conventional polishing pads to remove bulk material from the substrate surface. The residual material is generally present in an amount covering between about 5% and about 10% of the surface area of a substrate. Residual copper-containing material can include copper, copper alloys, doped copper, oxides of copper, copper alloys, and doped copper, and combinations thereof.

One substrate that may be polished by the processes described herein includes a dielectric layer with feature definitions formed therein, a barrier layer deposited generally on the dielectric layer, and a copper-containing material deposited on the barrier layer. As used throughout this disclosure, the phrase "copper-containing material", "copper" and the symbol Cu are intended to encompass high purity elemental copper as well as doped copper and copper-based alloys, e.g., doped copper and copper-based alloys containing at least about 80 wt. % copper. The barrier layer material may include tantalum, tantalum nitride, and derivatives thereof, such as tantalum silicon nitride. The invention described herein also contemplates the use of other barrier materials known or unknown that may be used as a barrier with conductive materials, such as copper.

The dielectric layer can comprise any of various dielectric materials known or unknown that may be employed in the manufacture of semiconductor devices. For example, dielectric materials, such as silicon dioxide, phosphorus-doped silicon glass (PSG), boron-phosphorus-doped silicon glass (BPSG), and carbon-doped silicon dioxide, can be employed. The dielectric layer may also include low dielectric constant (low k) materials, including fluoro-silicon glass (FSG), polymers, such as polymides, silicon carbide, such as BLOK™ dielectric materials, available from Applied Materials, Inc. of Santa Clara, Calif., and carbon-containing silicon oxides, such as BLACK DIAMOND™ dielectric materials, available from Applied Materials, Inc. of Santa Clara, Calif. The openings are formed in interlayer dielectrics by conventional photolithographic and etching techniques. The invention also contemplates the use of dielectric materials, known or unknown, that may be used as dielectric layers in semiconductor fabrication.

In one embodiment of the invention, a planarizing process for removing bulk conductive materials and conductive material residues from a substrate surface is provided. A retaining ring contact pressure of about 0.4 psi or greater, such as between about 2 psi and about 7.5 psi or greater, than a membrane pressure may be used with an abrasive or an abrasive-free polishing composition, typically the abrasive-free composition, when contacting the polishing article disposed on a platen. The ratio of retaining ring contact pressure and membrane pressure during polishing is greater than about 1.1:1 and less than or equal to about 5.5:1. The polishing process may further include a carrier head rotational speed greater than a platen rotational speed by a ratio of carrier head rotational speed to platen rotational speed of greater than about 1:1, such as between about 2:1 and about 12:1.

Alternatively, a multi-step planarization process is used for removing conductive materials and conductive material residues from a substrate surface. In a first step, an abrasive or abrasive-free polishing composition is used with the polishing article to remove bulk conductive material from the substrate surface at a retaining ring contact pressure of about 0.4 psi or greater, such as between about 2 psi and about 7.5 psi or greater, than a membrane pressure that may be used with an abrasive or an abrasive-free polishing composition. The ratio of retaining ring contact pressure and membrane pressure is greater than about 1.1:1 and less than or equal to about 5.5:1 during polishing for both the first and second steps. The first step may further include a first polishing pressure of about 3 psi or greater, such as between about 3 and about 8 psi, and a first platen rotational speed between about 10 rpm and about 200 rpm, such as between about 10 rpm and about 40 rpm. When polishing substrate containing low k dielectric materials, a first polishing pressure of about 1.5 psi or greater may be used.

In a second step, an abrasive or an abrasive-free polishing composition, typically the abrasive-free composition, is provided to the platen and the substrate is then contacted with the polishing article disposed thereon at a retaining ring contact pressure of about 0.4 psi or greater, such as between about 2 psi and about 7.5 psi or greater, than a membrane pressure and a carrier head rotational speed greater than a platen rotational speed by a ratio of carrier head rotational speed to platen rotational speed of greater than about 1:1, such as between about 2:1 and about 12:1.

The substrate may be polished at a second polishing pressure less than the first polishing pressure and a second platen rotational speed less than the first platen rotational speed. The second polishing pressure is about 2 psi or less, such as between about 0.5 psi and about 1.5 psi. For low k materials, the second polishing pressure is less than about 1 psi. The second platen rotational speed may be between about 10 rpm and about 200 rpm, such as between about 10 rpm and about 40 rpm. The second polishing step, which removes residual materials, advantageously stops on the underlying barrier layer, and is selective to the copper, thereby planarizing the surface of the substrate. Both the first and second polishing steps may be performed on the same platen or on separate platens.

A further description of a two-pressure polishing process is in U.S. patent application Ser. No. 09/469,709, filed on Dec. 21, 1999 and U.S. patent application Ser. No. 09/741,538, now U.S. Published patent application 2001/0004538, filed on Dec. 19, 2001, both of which are incorporated herein by reference to the extent not inconsistent with the disclosure or claimed aspects herein.

A barrier layer polishing composition is used with the polishing article to remove the barrier layer disposed above a dielectric layer. The barrier layer polishing composition may selectively remove the barrier layer in relation to the copper and dielectric materials, i.e., remove the barrier layer at higher removal rates than the copper or dielectric materials, or the barrier layer composition may non-selectively remove the copper, barrier, and dielectric materials at approximately equal rates.

The substrate may then be buffed following barrier layer removal to remove surface defects and particles adhering to the substrate surface. The above processing steps may be performed on the same apparatus or may be performed on more than one apparatus. Additionally, the substrate may be transferred to a cleaning module or subjected to an in situ cleaning process to also remove surface defects, such as oxides that form on the conductive material, such as copper-containing material.

While the invention is described in relation to processing steps, the steps described herein should not construed or interpreted as limiting the practice or scope of the invention. For example, the multi-step conductive materials polishing process steps may be performed as part of one distinct operation or may have overlapping processing during change from the first or bulk conductive material removal step to the second or residual conductive material removal step.

While the following process described herein illustrates polishing the substrate on three platens, the invention contemplates polishing the substrate by the process described herein on apparatus having one, two, four, or multiple platens. For example, the two conductive material polishing steps and the barrier polishing steps described herein may be performed on a single platen if desired by the operator. Further, the invention contemplates that the steps may be performed on the same platens or that portions of some process steps may be performed on multiple platens. For example, the polishing process may be performed removing a portion of the bulk conductive material on a first polishing platen and removing residual conductive material on a second polishing platen.

Additionally, while the process is described for removing copper and copper-containing materials, the invention also contemplates using the processes described herein to remove other conductive materials used in feature formation, such as tungsten and aluminum, including barrier layer materials, such as titanium, titanium nitride, tantalum, tantalum nitride, tungsten, and tungsten nitride, among others.

Additionally, while the following processing parameters are generally described for polishing 200 mm substrates, the invention contemplates modifying processing parameters to satisfy the requirements for polishing substrates of different sizes, such as 300 mm substrates, and polishing on various apparatus, such as orbital motion polishing apparatus. The process described below should be considered illustrative, and should not be construed or interpreted as limiting the scope of the invention.

Figure 5:
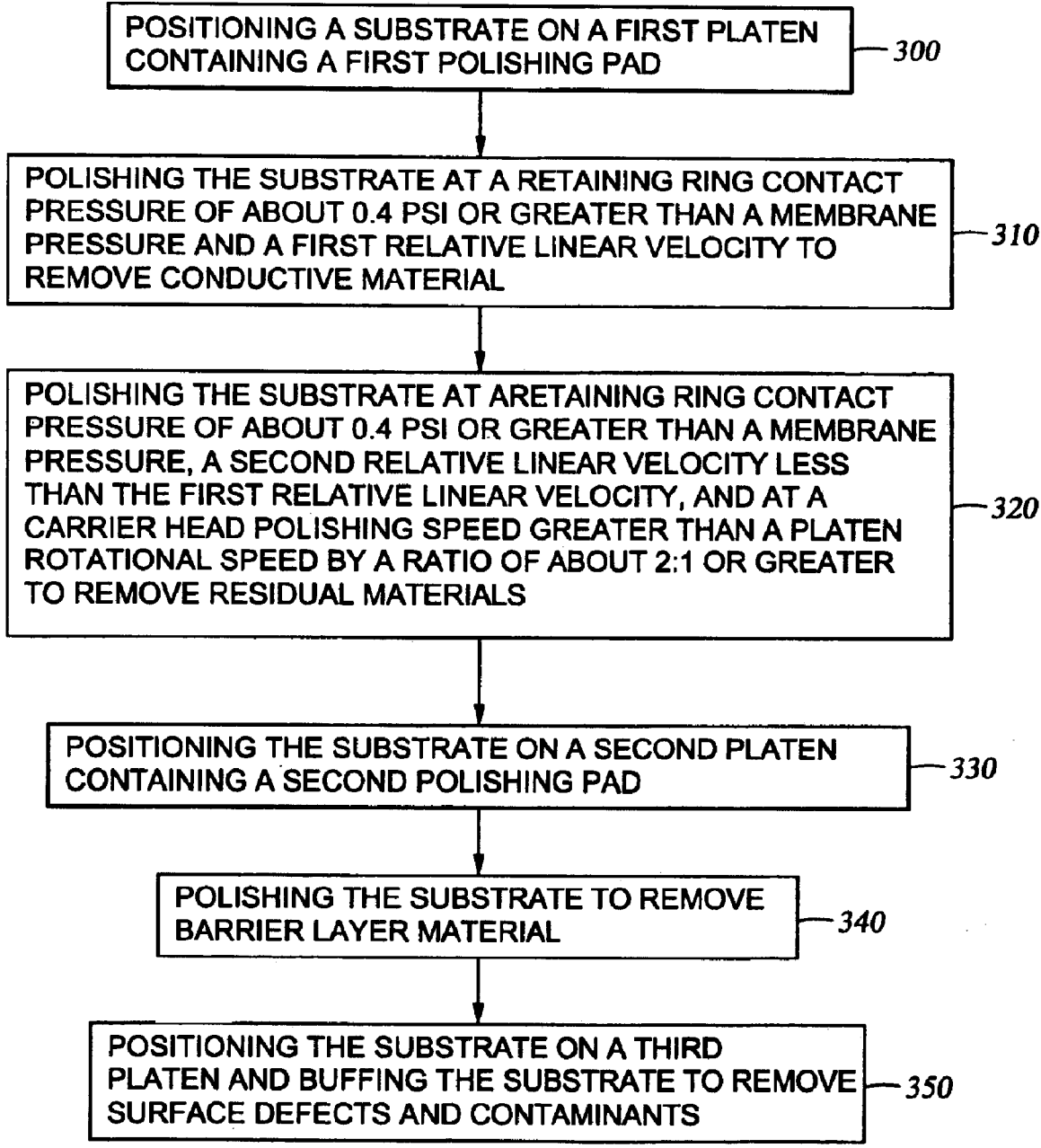
FIG. 5 is a flow chart illustrating the processing steps according to one embodiment of the invention.

FIG. 5 is a flow chart illustrating one embodiment of a process to remove copper-containing materials and barrier layer materials in a three step planarization process. A substrate is positioned on a first platen containing a polishing pad 100a disposed on platen 130 in polishing station 125a at step 300. A first polishing composition is supplied to the polishing pad 100a and the substrate is polished at a retaining ring contact pressure of about 0.4 psi or greater than a membrane pressure and a first linear velocity to remove at least a portion of the bulk conductive material from the substrate surface at step 310.

In the polishing process, the carousel 160 positions the substrate in contact with the polishing pad 100a, and the substrate and the polishing pad move relative to one another with the composition distributed therebetween to effect chemical and mechanical activity on the substrate, and then the substrate is typically removed from contact with the polishing pad 100a.

A polishing pressure of about 12 psi or less is generally applied between the substrate and the polishing article during the polishing process. A pressure between about 2 psi and about 11 psi, for example between about 2 psi and about 6 psi, is generally applied between the retaining ring and the polishing article during the polishing process. A membrane pressure between the membrane and the substrate of about 5 psi or less, for example between about 1 psi and about 2 psi, is typically used. A retaining ring contact pressure of about 0.4 psi or greater, for example, between about 3 psi and about 6 psi greater, than the membrane pressure may be maintained during polishing of the substrate.

The substrate disposed in a carrier head system 170a, 170b, 170c and 170d is rotated at a rotational speed between about 10 rpm and about 200 rpms. The rotatable platen 125a is typically rotated at a rotational speed between about 10 rpm and about 200 rpms. A rotational speed between about 40 rpm and 100 rpm for both the carrier head and the platen has been used to remove bulk material from the substrate surface. The polishing article and substrate are generally rotated in the same direction. At these rotational speeds, the substrate is polished with a relative linear velocity between about 600 mm/second and about 1675 mm/second at the center of the substrate. The platen rotational speeds and the carrier head rotational speeds are reached by accelerating the platen between about 5 rpms/second and about 30 rpms/second. An acceleration of the carrier head rotational speed and the platen rotational speed of about 30 rpms/second each has been observed to minimize delamination during polishing a substrate surface.

The bulk copper polishing composition is delivered or supplied to the polishing pad at a flow rate of about 150 ml/min or greater from a storage medium disposed near the CMP apparatus. Typically, a flow rate of between about 200 ml/min and about 300 ml/min may be supplied to the polishing pad for polishing the substrate. Examples of suitable polishing compositions, including abrasive-containing polishing compositions and abrasive-free polishing compositions, commercially available for removing copper-containing material in the first polishing step include EPC-5003, EPC-5001, and EPC-5306, available from Cabot Corp. of Aurora, Ill., and HS-C430-A3, HS-C430-A1, HS-C430-A22, HS-C430-A33, available from Hitachi Chemical Corp. of Japan, of which EPC-5001 is preferred for abrasive containing compositions and HS-C430-A3 is preferred for abrasive-free polishing compositions.

The substrate and the polishing pad are typically exposed to the polishing composition and contacted for a period of time sufficient to remove at least a portion or all of the bulk copper-containing material disposed thereon. For example, the polishing pad may be exposed to the first polishing composition between about 30 seconds and about 300 seconds, but may vary depending upon the material being removed, the concentration of the components of the first polishing composition, and the amount or thickness of bulk copper-containing material on the substrate. The copper-containing material may be removed at a rate between about 4000 Å/min and about 8,000 Å/min or any rate to remove the bulk copper-containing materials deposited on the substrate.

Next, the substrate is polished by supplying a second polishing composition to the polishing pad 100a and the substrate is polished at a retaining ring contact pressure of about 0.4 psi or greater than the membrane pressure and a second linear velocity less than the first linear velocity at step 320. The substrate is polished with a relative linear velocity between about 20 mm/second and less than or equal to about 600 mm/second, such as about 550 mm/second, at the center of the substrate at the rotational speed ratio and rotational speeds disclosed herein.

The second polishing pressure may also be less than the first polishing pressure. The first polishing pressure is typically about 3 psi or greater and the second polishing pressure is about 2 psi or less. However, for low k dielectric materials, the first polishing pressure may be between about 1.5 psi or greater and the second polishing pressure less than about 1 psi. For example, a polishing pressure of 3 psi, with a retaining ring contact pressure of about 3.4 psi and a membrane pressure of about 3 psi, may be used for the first polishing step and a polishing pressure of 2 psi, with a retaining ring contact pressure of about 2.4 psi and a membrane pressure of about 2 psi, may be used for the second polishing step.

The substrate disposed in a carrier head system 170a, 170b, 170c, and 170d is rotated at a rotational speed ratio of greater than about 1:1, such as between about 2:1 and about 12:1, than the platen rotational speed. The polishing pad 100a, 100b, and 100c are rotated at a rate between about 10 rpm and about 50 rpm for a polishing pad disposed on a rotatable platen and the substrate is rotated at a carrier head rotational speed between about 20 rpm and about 150 rpms, such as about 143 rpms or higher. A carrier head rotational speed between about 60 rpm and about 90 rpm and a platen rotational speed between about 15 rpm and about 50 rpm have been observed to sufficiently remove residual materials. Alternatively, a platen speed of about 143 rpms is used with a carrier head rotational speed of about 43 rpm during polishing.

The platen rotational speeds and the carrier head rotational speeds are reached by accelerating the platen between about 5 rpms/second and about 30 rpms/second. An acceleration of about 30 rpms/second has been observed to minimize delamination during polishing a substrate surface.

An acceleration of the carrier head rotational speed and the platen rotational speed of about 30 rpms/second each has been observed to minimize delamination during polishing a substrate surface.

The second polishing composition is delivered or supplied to the polishing pad 100a, 100b, and 100c at a flow rate between about 50 ml/min or greater, such as between about 50 ml/min and about 100 ml/min from a storage medium disposed in or near the CMP apparatus. A polishing composition flow rate of between about 70 ml/min and 80 ml/min has been used to polish the substrate surface at the rotational speeds described in this step. Modification of the processing parameters will allow the same polishing composition to be used for the first and second steps and as well as on the first and second platens. An abrasive-free polishing composition may be used to control dishing in the second polishing step. An example of a commercially available abrasive-free polishing composition includes HS-C430-A3, commercially available from Hitachi Chemical Corp. of Japan and commercially available abrasive-containing polishing compositions include EPC-5001 and EPC-5003 from Cabot Corp. of Aurora, Ill.

The substrate and the polishing article are typically exposed to the second polishing composition for a period of time sufficient to remove the residual copper-containing materials disposed thereon and provide for overpolishing of the substrate surface to further remove defects formed thereon. For example, the polishing article may be exposed to the second polishing composition between about 30 seconds and about 300 seconds, but may vary depending upon the material being removed, the concentration of the components of the second polishing composition, and the amount or thickness of residual copper material on the substrate. The conductive material is typically removed at a rate between about 1500 Å/min and about 5500 Å/min by the process described herein.

It has been observed that the two-step polishing process described above reduces dishing of the copper-containing material, reduces the presence of residual materials, and reduces the formation of topographical defects and delamination scratches on the substrate surface during chemical mechanical polishing of the substrate surface.

The substrate is then positioned on a second platen containing a polishing pad 100b at step 330, and typically includes positioning a substrate on the second polishing pad 100b disposed on platen 130 in polishing station 125b. A barrier removal polishing composition is then supplied to the polishing pad 100b and barrier layer materials, such as tantalum containing materials, are then removed from the surface of the substrate by a polishing process on the substrate at step 340. The barrier removal polishing composition may be an abrasive-free composition or contain up to about 5 wt. % of abrasive particles.

The polishing pad 100b is rotated at a rate between about 50 rpm and about 120 rpm for a polishing pad disposed on a rotatable platen. The substrate disposed in a carrier head system 170a, 170b, 170c and 170d is rotated at a rate between about 50 rpm and about 120 rpms. The polishing pad and substrate are rotated in the same direction to provide a relative motion between one another. A pressure between about 0.5 psi and about 6 psi between the substrate and the polishing pad 100b is used to provide mechanical activity to the polishing process.

The barrier layer polishing composition is delivered or supplied to the polishing pad at a flow rate of about 200 ml/min or greater from a storage medium disposed near the CMP apparatus. Examples of suitable polishing compositions, including abrasive-containing polishing compositions and abrasive-free polishing compositions, commercially available for removing barrier layer material in the third polishing step include HS-T605 and HS-T505, available from Hitachi Chemical Corp. of Japan. The substrate and the polishing pad are typically exposed to the polishing composition and contacted for a period of time sufficient to remove the barrier layer material, for example between about 60 seconds and about 180 seconds. The barrier layer materials may be removed at a rate up to about 1200 Å/min.

The substrate may then be transferred to the third polishing platen having the third polishing pad 100c for a buffing process at step 350. An example of a buffing process comprises positioning the substrate on the third platen having a soft polishing pad, such as a Politex pad, delivering a cleaning composition, such as an ELECTRA CLEAN ™ composition available from Applied Materials, of Santa Clara Calif., to the polishing pad and polishing at 63 rpm and a contact pressure of about 2 psi for 20 seconds, washing the substrate surface with deionized water for 10 seconds, and applying a polishing slurry, such as an ELECTRAPOLISH™ composition available from Applied Materials, of Santa Clara Calif., to the polishing pad and polishing at 63 rpm and a contact pressure of about 2 psi for 20 seconds.

Optionally, a cleaning solution may be applied to each of the polishing pads during or subsequent each of the polishing process to remove particulate matter and spent reagents from the polishing process as well as help minimize metal residue deposition on the polishing pads and defects formed on a substrate surface. An example of a suitable cleaning solution is ELECTRA CLEAN™ composition commercially available from Applied Materials, Inc., of Santa Clara, Calif.

It was discovered by the inventors that a ratio of retaining ring contact pressure to membrane pressure greater than about 1.1:1 and/or a retaining ring pressure of about 0.4 psi or greater than the membrane pressure reduces or minimizes defect formation and delamination of films of films from the substrate surface. While not subscribing to any particular theory, it is believed that the pressure difference between the retaining ring contact pressure and the membrane pressure reduces friction at the edge of the substrate and the polishing article during polishing.

Friction at non-uniform points on a substrate surface, such as electroplating pin points, will aggravate surface defects to initiate delamination of films. It has also been observed that increased substrate or carrier head rotational speed results in reduced friction and that lower platen rotation speed results in reduced friction during polishing. Low k dielectric materials are particularly sensitive to friction from shear forces, and the reduced friction reduces the force that may damage low k films and result in delamination.

Compositions, such as abrasive-containing films, also achieve reduced friction levels, and delamination was observed to be reduced or minimized. This is believed to occur because the abrasives in the composition operate as lubricants, compared to abrasive-free films. Additionally corner-less polishing pad have reduced friction levels and have an absence of grooves, windows, or edges, which can "blade" or damage films on the substrate surface. Also, groove-less retaining rings, which have a tendency to decrease the smoothness of polishing pads through gouging or damaging the polishing pads, are also used to reduce system friction and reduce or minimize film delamination.

It is further believed that the rotational speeds described herein and the ratio of rotational speeds provide a relative linear velocity to the substrate surface, which results in removal of residual conductive materials with reduced non-uniformity, further enhanced by reduced polishing composition flow rates, compared to previous polishing processes. The recognition of the relative linear velocity as a characterization of the ability to remove residual materials allows the process to be modified for use with alterative processes and systems, such as a non-rotary surface, e.g., a linear polishing system, using a sliding or circulating polishing belt or similar device, which can produce relative linear velocities between a rotating substrate surface and the polishing article.

A series of substrates were polished according to the two-step polishing process described above in steps 300–350. A first experimental process was performed on a MIRRA® three platen polishing system using Cabot EPC-5001 composition on a IC-1010 polishing pad on platen 1, an ELECTRAPOLISH™ polishing composition from Applied Materials, Inc., of Santa Clara, Calif., on a IC-1010 on platen 2, and an ELECTRAPOLISH™ polishing composition on a POLITEX pad on platen 3.

The substrates polished under the processing condition shown in Table 1 below comprise a substrate stack of silicon, a first BLACK DIAMOND™ low k dielectric film, a BLOK™ low k dielectric film, a second BLACK DIAMOND™ low k dielectric film, a dielectric anti-reflective coating (DARC), which a feature definition was formed in the dielectric layers and filled using a tantalum nitride barrier layer, and then a copper fill of the feature definition. An example substrate may contain a silicon surface, 1 $\mu$m thick BLACK DIAMOND™ dielectric layer, 500 Å thick BLOK™ dielectric barrier layer/etch stop, 5000 Å thick BLACK DIAMOND™ dielectric layer formed thereon. A feature definition was formed in the dielectric layers and filled with a 250 Å layer of tantalum nitride and 2000 Å of copper seed layer followed by 1 $\mu$m of electroplated copper. A series of substrates composed above was polished using the compositions and polishing pads described above by the processes parameters listed in Table 1 below:

TABLE 1

Experimental Processing Parameters

| Wafer # | P1(1$^{st}$) | Prr/ Pm | Peeling/ RR | Peeling | P1(2$^{nd}$) | P2 | P3 |
| --- | --- | --- | --- | --- | --- | --- | --- |
| W1 (Control) | 3/93/3.4 for 40 s | 1.1 | 2 | 2 | 2/43/2.3 | 3/103/3.4 | P3 Buffing |
| W2 (Control) | 3/93/3.4 for 40 s | 1.1 | 2 | | 2/43/2.3 | 3/103/3.4 | P3 Buffing |
| W3 | 3/93/6 for 40 s | 2 | 1 | 1 | 2/43/4 | 3/103/6 | P3 Buffing |

TABLE 1-continued

Experimental Processing Parameters

| Wafer # | P1(1st) | Prr/Pm | Peeling/RR | Peeling | P1(2nd) | P2 | P3 |
|---|---|---|---|---|---|---|---|
| W4 | 3/93/6 for 40 s | 2 | 1 | | 2/43/4 | 3/103/6 | P3 Buffing |
| W5 | 3/93/7.5 for 40 s | 2.5 | 0 | 0.5 | 2/43/5 | 3/103/7.5 | P3 Buffing |
| W6 | 3/93/7.5 far 40 s | 2.5 | 1 | | 2/43/5 | 3/103/7.5 | P3 Buffing |
| W7 | 3/93/9 for 40 s | 3 | 0 | 0.5 | 2/43/6 | 3/103/9 | P3 Buffing |
| W8 | 3/93/9 for 40 s | 3 | 1 | | 2/43/6 | 3/103/9 | P3 Buffing |
| W9 | 3/93/10.5 for 40 s | 3.5 | 1 | 1 | 2/43/7 | 3/103/10.5 | P3 Buffing |
| W10 | 3/93/10.5 for 40 s | 3.5 | 1 | | 2/43/7 | 3/103/10.5 | P3 Buffing |
| W11 (Control) | 2/43/2.3 for 120 s | 1.1 | 2 | 2 | 2/43 | 3/103 | P3 Buffing |
| W12 (Control) | 2/43/2.3 for 120 s | 1.1 | 2 | | 2/43 | 3/103 | P3 Buffing |
| W13 | 2/43/5 for 120 s | 2.5 | 0 | 0.5 | 2/43/5 | 3/103/7.5 | P3 Buffing |
| W14 | 2/43/5 for 120 s | 2.5 | 1 | | 2/43/5 | 3/103/7.5 | P3 Buffing |

Referring to Table 1, Wafer # indicates the substrate designation including the four control substrates W1, W2, W11, and W12. P1 ($1^{st}$) is the process parameters for the first polishing step on platen 1 for removing bulk copper, including polishing pressure, platen rotational speed, and retaining ring contact pressure for a determined period of time in seconds, respectively. The (Prr/Pm) ratio is a ratio of retaining ring contact pressure and the membrane pressure used during the polishing process. Peeling/RR is the observed peeling after the first polishing step on platen 1 (P1) with peeling being the arbitrary measurement of delamination (3-massive, 2-minor, 1-almost no peeling, 0-no peeling).

P1 ($2^{nd}$) is the process parameters for the second polishing step on platen 1 for removing bulk copper, including polishing pressure, platen rotational speed, and retaining ring contact pressure for a determined period of time in seconds, respectively. P2 is the process parameters on platen 2 for barrier removal, including polishing pressure, platen rotational speed, and retaining ring contact pressure for a determined period of time in seconds, for a polishing process to remove residual copper. And P3 is the buffing portion of the planarization process for removal of the tantalum nitride barrier layer. The pressure difference (ΔP) of retaining ring of about 2 psi, a retaining ring pressure of about 5 psi, a membrane pressure of about 2 psi, a ratio of retaining ring pressure to membrane pressure of about 2.5, and at a platen rotational speed of about 43 rpm, on the first polishing platen for 120 seconds to remove bulk material from the substrate surface. The substrate was analyzed and peeling was observed to be minimal, i.e., peeling=0.5 or less.

In a second step, the substrate was then polished at a contact pressure of about 2 psi, a retaining ring pressure of about 5 psi, a membrane pressure of about 2 psi, a ratio of retaining ring pressure to membrane pressure of about 2.5, and at a platen rotational speed of about 43 rpms, on the first polishing platen to remove any residual materials. The substrate was then transferred to a second platen and the barrier layer of the substrate was removed in a third step at a contact pressure of about 3 psi and at a platen rotational speed of about 103 rpm for about 30 seconds. The substrate was then transferred to the third polishing platen for a buffing process.

Additional substrates were polished to remove conductive material according to the process parameters shown in Table 2.

TABLE 2

Rotational Speed Differential
Degree of peeling (0 = no, 1 = almost none, 2 = minor, 3severe)

Figure 6:
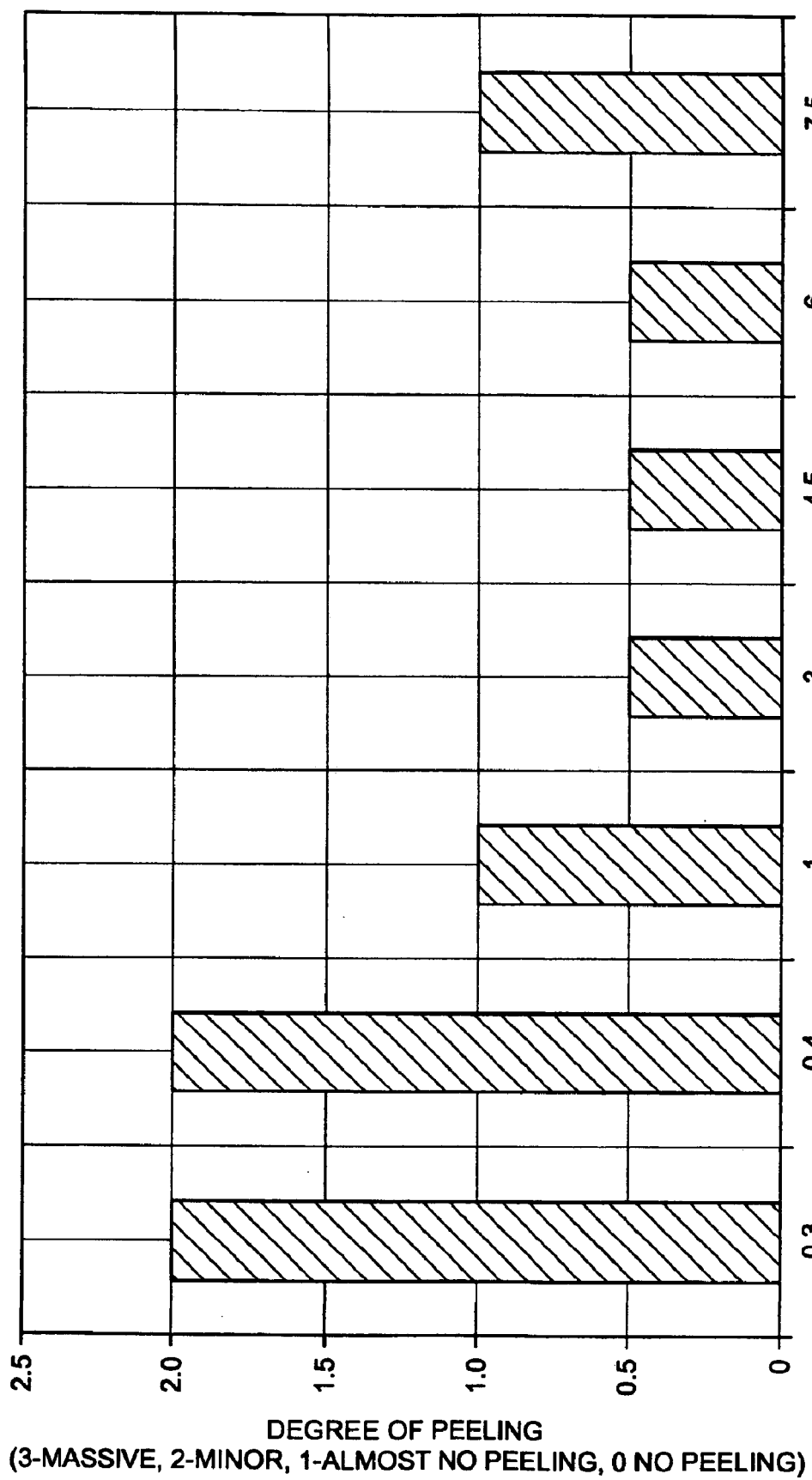
FIG. 6 is a bar graph illustrating the degree of peeling or delamination versus the difference in retaining ring pressure and membrane pressure.

| | Removal Rate | | $1^{st}$ stage | | $2^{nd}$ stage | | $3^{rd}$ stage | | $4^{th}$ stage | |
|---|---|---|---|---|---|---|---|---|---|---|
| | Process | Rate (A/min) | Time | Peeling | Time | peeling | Time | peeling | Time | peeling |
| Split1 | RR = 3.4/PI = 120/H = 10 | 4000 | 60 | 1 | 30 | 2 | 30 | 2.5 | Stop | — |
| Split2 | RR = 3.4/PI = 10/H = 120 | 1200 | 60 | 0 | 180 | 0 | 180 | 0 | 180 | 0 |
| Split3 | RR = 6.8/pi = 120/H = 10 | 5700 | 60 | 0.5 | 30 | 0.5 | 30 | 0.5 | Stop | — |
| Split4 | RR = 6.8/PI = 10/H = 120 | 1100 | 60 | 0.5 | 180 | 0.5 | 180 | 1 | 180 | 1 | pressure and membrane pressure versus degree of peeling is shown in the bar graph of FIG. 6.

As shown in FIG. 6, delamination of films from the substrate surface by the processes described in Table 1 was minimized when the pressure of the retaining ring was 3 psi or greater with consistent result of minimal peeling in the range of 3 psi to 6 psi.

One example indicating minimal peeling by increased retaining ring pressure over membrane pressure is wafer 13 as presented in Table 1. Wafer 13 was polished as follows. In a first step, the substrate was polished at a contact pressure The process parameters of Table 2 are as follows. Split is the wafer number, RR is the retaining ring contact pressure in psi, P1 is the platen rotational speed in rpm, H is the carrier head rotational speed in rpm and peeling is the degree of delamination with 0 being no observable peeling, 1 being almost no peeling, 2 being minor peeling of the substrate surface, an 3 being severe peeling of the film from the substrate surface. The substrates of Table 2 were analyzed and it was observed that decreasing platen rotational speed results in reduced film delamination, increasing carrier head rotational speed resulting in reduced film delamination, and a greater carrier head rotational speed than platen rotational speed resulted in reduced film delamination.

One example indicating minimal peeling by increased carrier head speed and reduced platen speed is Split #2. Copper material disposed on the substrate surface as described above was removed at a retaining ring pressure of about 3.4 psi at a platen rotational speed of about 10 rpm and a carrier head rotational speed of about 120, i.e., a ratio of 12:1 carrier head to platen rotational speed, to remove bulk material at a rate of about 1200 Å/min. The polishing process was stopped at four periods of time or stages during the polishing process and analyzed for peeling and other surface defects. The substrate was observed after 60 seconds, stage 1, an additional 180 seconds, stage 2, an additional 180 seconds, stage 3, and an additional 180 seconds, stage 4. The substrate was analyzed and no peeling was observable, i.e., peeling=0, at any of the four stages of the polishing process.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    positioning a substrate having a conductive material formed thereon in a polishing apparatus having one or more rotational carrier heads and one or more rotatable platens, wherein each carrier head comprises a retaining ring and a membrane for securing a substrate in each carrier head and each platen has a polishing article disposed thereon;
    contacting a substrate surface with the polishing article at a ratio of retaining ring contact pressure to membrane pressure between about 2:1 and about 3.5:1, wherein the membrane pressure is between about 2 and about 6 psi; and
    polishing the substrate surface to remove conductive material from the substrate, wherein polishing the substrate comprises polishing the substrate at a ratio of carrier head rotational speed to platen rotational speed of between about 2:1 and about 12:1.

2. The method of claim 1, wherein the retaining ring contact pressure is between about 0.4 psi and about 7.5 psi greater than a membrane pressure.

3. The method of claim 1, wherein the platen rotational speed and a carrier head rotational speed provide a relative linear velocity between about 20 mm/second and about 1675 mm/second at the center of the substrate.

4. A method for processing a substrate, comprising:
    positioning a substrate having a conductive material formed thereon in a polishing apparatus having one or more rotational carrier heads and one or more rotatable platens, wherein each carrier head comprises a retaining ring and a membrane for securing a substrate in each carrier head and each platen has a polishing article disposed thereon;
    contacting a substrate surface with the polishing article at a ratio of retaining ring contact pressure to membrane pressure of greater than about 1.1:1, wherein the membrane pressure is between about 1 psi and about 2 psi; and
    polishing a substrate surface to remove conductive material from the substrate, wherein polishing the substrate comprises polishing the substrate at a ratio of carrier head rotational speed to platen rotational speed of between about 2:1 and about 12:1.

5. A method for processing a substrate, comprising:
    positioning a substrate having a conductive material formed thereon in a polishing apparatus having one or more rotational carrier heads and one or more rotatable platens, wherein the each carrier head comprises a retaining ring and a membrane for securing a substrate in the each carrier head and each platen has a polishing article disposed thereon;
    contacting the a substrate surface with the polishing article at a ratio of retaining ring contact pressure to membrane pressure of greater than about 1.1:1, wherein the membrane pressure is between about 1 psi and about 2 psi; and
    polishing the substrate surface to remove conductive material from the substrate, wherein the platen rotational speed and a carrier head rotational speed provide a relative linear velocity between about 20 mm/second and about 1675 mm/second at the center of the substrate.

6. A method for processing a substrate, comprising:
    positioning a substrate having a conductive material formed thereon in a polishing apparatus having one or more rotational carrier heads and one or more rotatable platens, wherein each carrier head comprises a retaining ring and a membrane for securing a substrate in each carrier head and each platen has a polishing article disposed thereon;
    contacting a substrate surface with the polishing article at a ratio of retaining ring contact pressure to membrane pressure of greater than about 1.1:1; and
    polishing the substrate surface to remove conductive material from the substrate at a ratio of carrier head rotational speed to platen rotational speed of between about 1:1 and about 12:1 and a relative linear velocity between about 20 mm/second and about 1675 mm/second at the center of the substrate, wherein the carrier head has a carrier head rotational speed between about 10 rpm and about 120 rpm, the platen has a platen rotational speed between about 10 rpm and about 40 rpm.

7. The method of claim 6, wherein the retaining ring contact pressure is between about 0.4 psi and about 7.5 psi greater than a membrane pressure.

8. The method of claim 6, wherein the membrane pressure is between about 2 psi and about 6 psi.

9. The method of claim 6, wherein the ratio of retaining ring contact pressure to membrane pressure between about 2:1 and about 3.5:1.

10. The method of claim 6, wherein polishing the substrate comprises polishing the substrate at a ratio of carrier head rotational speed to platen rotational speed of between about 2:1 and about 12:1.

11. A method for processing a substrate, comprising:
    positioning a substrate having a conductive material formed thereon in a polishing apparatus having one or more rotational carrier heads and one or more rotatable platens, wherein each carrier head comprises a retaining ring and a membrane for securing a substrate in each carrier head and each platen has a polishing article disposed thereon;
    contacting a substrate surface with the polishing article at a ratio of retaining ring contact pressure to membrane pressure of greater than about 1.1:1; and
    polishing the substrate surface to remove conductive material from the substrate, wherein polishing the substrate comprises polishing the substrate at a first carrier head rotational speed and a first platen rotational speed and then polishing the substrate at a second carrier head rotational speed less than the first carrier head rotation speed and a second platen rotational speed less than the first platen rotational speed.

12. The method of claim 11, wherein the first platen rotational speed and a first carrier head rotational speed provide a first relative linear velocity between about 600 mm/second and about 1675 mm/second at the center of the substrate and the second platen rotational speed and a second carrier head rotational speed provide a second relative linear velocity between about 20 mm/second and about 550 mm/second at the center of the substrate.

13. The method of claim 12, wherein the first relative linear velocity is between about 1000 mm/second and about 1200 mm/second at the center of the substrate and the second relative linear velocity is between about 20 mm/second and about 400 mm/second at the center of the substrate.

14. The method of claim 11, wherein a second linear velocity is provided by a platen rotational speed between about 10 rpm and about 40 rpm and a carrier head rotational speed between about 20 rpm and about 120 rpm, wherein the second carrier head rotational speed is greater than the second platen rotational speed by a ratio of second carrier head rotational speed to second platen rotational speed of between about 2:1 and about 3:1.

15. The method of claim 11, wherein the second carrier head rotational speed is between about 60 rpm and about 90 rpm and the second platen rotational speed between about 15 rpm and about 50 rpm, wherein the second carrier head rotational speed is greater than the second platen rotational speed by a ratio of second carrier head rotational speed to second platen rotational speed of between about 2:1 and about 3:1.

16. The method of claim 11, further comprising polishing the substrate at a membrane pressure between about 0.5 psi and about 2 psi.

17. The method of claim 16, wherein a retaining ring contact pressure is between about 0.4 psi and about 7.5 psi greater than a membrane pressure.

18. The method of claim 17, wherein a ratio of retaining ring contact pressure to membrane pressure is greater than about 1.1:1 and less than about 5.5:1.

19. The method of claim 11, further comprising polishing the substrate to remove a barrier layer material disposed under the conductive material.

20. The method of claim 19, further comprising buffing the substrate on a third platen.

21. The method of claim 11, wherein the polishing article comprises a solid, pattern-free, abrasive-free polishing pad.

22. The method of claim 11, wherein the conductive material comprises copper, doped copper, copper alloys, or combinations thereof.

23. A method for processing a substrate, comprising:
positioning a substrate comprising copper features formed in a low k dielectric layer and a tantalum containing material disposed therebetween, in a polishing apparatus having one or more rotational carrier heads and one or more rotatable platens, wherein each carrier head comprises a retaining ring and a membrane for securing the substrate in each carrier head and each platen has a polishing article disposed thereon;
contacting the substrate surface and the polishing article to each other at a retaining ring contact pressure of about 0.4 psi or greater than a membrane pressure at a ratio of retaining ring contact pressure to membrane pressure greater than about 1.1:1 and less than or equal to about 5.5:1;
polishing the substrate at a first relative linear velocity of about 600 mm/second or greater at the center of the substrate; and
polishing the substrate at a second relative linear velocity of less than about 600 mm/second or less at the center of the substrate.

24. The method of claim 23, wherein the second relative linear velocity is produced at a platen rotational speed between about 10 rpm and about 40 rpm and a carrier head rotational speed between about 20 rpm and about 120 rpm.

25. The method of claim 23, wherein the second relative linear velocity is produced at a platen rotational speed between about 15 rpm and about 50 rpm and a carrier head rotational speed between about 60 rpm and about 90 rpm.

26. The method of claim 23, wherein the membrane pressure is between about 0.5 psi and about 2 psi.

27. The method of claim 23, wherein the retaining ring pressure is between about 3 psi and about 8 psi.

28. The method of claim 23, wherein a ratio of retaining ring contact pressure to membrane pressure is between about 2:1 and about 3.5:1.

29. The method of claim 23, further comprising polishing the substrate to remove a barrier layer material disposed under the copper features.

30. The method of claim 29, further comprising buffing the substrate on a third platen.

31. The method of claim 23, wherein the polishing article comprises a solid, pattern-free, abrasive-free polishing pad.

32. The method of claim 23, wherein the copper features comprise copper, doped copper, copper alloys, or combinations thereof.

33. The method of claim 23, wherein the second linear velocity is provided by polishing the substrate at a ratio of carrier head rotational speed to platen rotational speed of between about 2:1 and about 12:1.

34. The method of claim 23, wherein the second linear velocity is provided by polishing the substrate at a ratio of carrier head rotational speed to platen rotational speed of between about 2:1 and about 3:1.

* * * * *

UNITED STATES PATENT AND TRADEMARK OFFICE
CERTIFICATE OF CORRECTION

PATENT NO.        : 6,960,521 B2
APPLICATION NO. : 10/939750
DATED             : November 1, 2005
INVENTOR(S)       : Yongsik et al.

It is certified that error appears in the above-identified patent and that said Letters Patent is hereby corrected as shown below:

On the Title Page,

Item [56], References Cited, U.S. PATENT DOCUMENTS: Please include the following reference:

6,204,181      3/2001      Molnar

Column 5, Line 16: After "Inc.", change the comma to a period

Column 5, Line 64: After "drive", insert --)--

Column 7, Line 6: Change "maybe" to --may be--

Column 7, Line 44: Change the comma after "stationary" to a semicolon

Column 7, Lines 51 and 52: Change each instance of "rpms" to --rpm--

Column 8, Lines 36 and 37: Change each instance of "rpms" to --rpm--

Column 10, Line 35: Delete "develop"

Column 10, Line 67: Delete "than"

Column 11, Line 8: Change "respectfully" to --respectively--

Column 11, Line 13: Change "mm/seconds" to --mm/second--

Column 11, Line 20: Change "illustrate" to --illustrated--

Column 13, Line 44: Before "construed", insert --be--

Column 14, Line 43: Before "greater", insert --or--

Column 14, Lines 47, 49, 58, and 60: Change each instance of "rpms" to --rpm--

Column 15, Lines 55, 56, 60, 65, and 66: Change each instance of "rpms" to --rpm--

Column 16, Line 2: Change "rpms" to --rpm--

Column 16, Line 7: Change "between" to --of--

UNITED STATES PATENT AND TRADEMARK OFFICE
CERTIFICATE OF CORRECTION

PATENT NO. : 6,960,521 B2
APPLICATION NO. : 10/939750
DATED : November 1, 2005
INVENTOR(S) : Yongsik et al.

It is certified that error appears in the above-identified patent and that said Letters Patent is hereby corrected as shown below:

Column 16, Line 58: Change "rpms" to --rpm--

Column 17, Line 38: Delete the first instance of "of films"

Column 20, Line 32: Change "rpms" to --rpm--

Column 20, Table 2: Change "3severe" to --3 = severe--

Column 20, Line 60: Change "P1" to --Pl--

Column 20, Line 63: Before "3", change "an" to --and--

Column 20, Line 67: Change "resulting" to --results--

Column 22, Line 5: Before "each", delete "the"

Column 22, Line 7: Before "each", delete "the"

Column 22, Line 48: Before "between", insert --is--

Column 23, Line 4: Change "rotation" to --rotational--

Signed and Sealed this

Third Day of October, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,960,521 B2 |
| APPLICATION NO. | : 10/939750 |
| DATED | : November 1, 2005 |
| INVENTOR(S) | : Yongsik Moon et al. |

It is certified that error appears in the above-identified patent and that said Letters Patent is hereby corrected as shown below:

<u>On the Title Page,</u>

Item [56], References Cited, U.S. PATENT DOCUMENTS: Please include the following reference:

6,204,181      3/2001      Molnar

Column 5, Line 16: After "Inc.", change the comma to a period

Column 5, Line 64: After "drive", insert --)--

Column 7, Line 6: Change "maybe" to --may be--

Column 7, Line 44: Change the comma after "stationary" to a semicolon

Column 7, Lines 51 and 52: Change each instance of "rpms" to --rpm--

Column 8, Lines 36 and 37: Change each instance of "rpms" to --rpm--

Column 10, Line 35: Delete "develop"

Column 10, Line 67: Delete "than"

Column 11, Line 8: Change "respectfully" to --respectively--

Column 11, Line 13: Change "mm/seconds" to --mm/second--

Column 11, Line 20: Change "illustrate" to --illustrated--

Column 13, Line 44: Before "construed", insert --be--

Column 14, Line 43: Before "greater", insert --or--

Column 14, Lines 47, 49, 58, and 60: Change each instance of "rpms" to --rpm--

Column 15, Lines 55, 56, 60, 65, and 66: Change each instance of "rpms" to --rpm--

Column 16, Line 2: Change "rpms" to --rpm--

Column 16, Line 7: Change "between" to --of--

UNITED STATES PATENT AND TRADEMARK OFFICE
CERTIFICATE OF CORRECTION

PATENT NO.        : 6,960,521 B2
APPLICATION NO.   : 10/939750
DATED             : November 1, 2005
INVENTOR(S)       : Yongsik Moon et al.

It is certified that error appears in the above-identified patent and that said Letters Patent is hereby corrected as shown below:

Column 16, Line 58: Change "rpms" to --rpm--

Column 17, Line 38: Delete the first instance of "of films"

Column 20, Line 32: Change "rpms" to --rpm--

Column 20, Table 2: Change "3severe" to --3 = severe--

Column 20, Line 60: Change "P1" to --Pl--

Column 20, Line 63: Before "3", change "an" to --and--

Column 20, Line 67: Change "resulting" to --results--

Column 22, Line 5: Before "each", delete "the"

Column 22, Line 7: Before "each", delete "the"

Column 22, Line 48: Before "between", insert --is--

Column 23, Line 4: Change "rotation" to --rotational--

This certificate supersedes Certificate of Correction issued October 3, 2006.

Signed and Sealed this

Second Day of January, 2007

JON W. DUDAS
*Director of the United States Patent and Trademark Office*